United States Patent
Zhang

(10) Patent No.: US 10,372,359 B2
(45) Date of Patent: Aug. 6, 2019

(54) PROCESSOR FOR REALIZING AT LEAST TWO CATEGORIES OF FUNCTIONS

(71) Applicant: ChengDu HaiCun IP Technology LLC, ChengDu (CN)

(72) Inventor: Guobiao Zhang, Corvallis, OR (US)

(73) Assignees: ChengDu HaiCun IP Technology LLC, ChengDu, SiChuan (CN); Guobiao Zhang, Corvallis, OR (US)

( * ) Notice: Subject to any disclaimer, the term of this patent is extended or adjusted under 35 U.S.C. 154(b) by 93 days.

(21) Appl. No.: 15/591,205

(22) Filed: May 10, 2017

(65) Prior Publication Data
US 2017/0329548 A1    Nov. 16, 2017

(30) Foreign Application Priority Data

May 10, 2016   (CN) .......................... 2016 1 0307350
May 8, 2017    (CN) .......................... 2017 1 0315871

(51) Int. Cl.
| | |
|---|---|
| *G06F 12/00* | (2006.01) |
| *G06F 3/06* | (2006.01) |
| *G11C 5/00* | (2006.01) |
| *G11C 17/10* | (2006.01) |
| *G11C 29/00* | (2006.01) |
| *G06F 3/00* | (2006.01) |

(52) U.S. Cl.
CPC .......... *G06F 3/0629* (2013.01); *G06F 3/0617* (2013.01); *G06F 3/0683* (2013.01); *G06F 12/00* (2013.01); *G11C 5/005* (2013.01); *G11C 17/10* (2013.01); *G11C 29/76* (2013.01)

(58) Field of Classification Search
CPC ...................................... G06F 12/00
USPC .......................................................... 711/154
See application file for complete search history.

(56) References Cited

U.S. PATENT DOCUMENTS

| | | |
|---|---|---|
| 4,870,302 A | 9/1989 | Freeman |
| 5,046,038 A | 9/1991 | Briggs et al. |
| 5,060,182 A | 10/1991 | Briggs et al. |
| 5,604,499 A | 2/1997 | Miyagoshi et al. |
| 5,835,396 A | 11/1998 | Zhang |
| 5,901,274 A | 5/1999 | Oh |
| 5,954,787 A | 9/1999 | Eun |
| 6,181,355 B1 | 1/2001 | Brethour et al. |
| 6,263,470 B1 | 7/2001 | Hung et al. |
| 7,028,247 B2 | 4/2006 | Lee |
| 7,206,410 B2 | 4/2007 | Bertoni et al. |
| 7,366,748 B1 | 4/2008 | Tang et al. |
| 7,472,149 B2 | 12/2008 | Endo |
| 7,512,647 B2 | 3/2009 | Wilson et al. |
| 7,574,468 B1 | 4/2009 | Rayala |

(Continued)

OTHER PUBLICATIONS

Harrison et al., "The Computation of Transcendental Functions on the IA-64 Architecture", Intel Technical Journal, Q4, 1999.

*Primary Examiner* — Gautam Sain

(57) ABSTRACT

The present invention discloses a first preferred processor comprising a fixed look-up table circuit (LTC) and a writable LTC. The fixed LTC realizes at least a common function while the writable LTC realizes at least a non-common function. The present invention further discloses a second preferred processor comprising a two-dimensional (2-D) LTC and a three-dimensional (3-D) LTC. The 2-D LTC realizes at least a fast function while the 3-D LTC realizes at least a non-fast function.

20 Claims, 7 Drawing Sheets

(56) References Cited

U.S. PATENT DOCUMENTS

| | | |
|---|---|---|
| 7,539,927 B2 | 5/2009 | Lee et al. |
| 7,634,524 B2 | 12/2009 | Okutani et al. |
| 7,962,543 B2 | 6/2011 | Schulte et al. |
| 8,203,564 B2 | 6/2012 | Jiao et al. |
| 8,487,948 B2 | 7/2013 | Kai et al. |
| 9,015,452 B2 | 4/2015 | Dasgupta |
| 9,207,910 B2 | 12/2015 | Azadet et al. |
| 9,225,501 B2 | 12/2015 | Azadet |
| 9,465,580 B2 | 10/2016 | Pineiro et al. |
| 9,606,796 B2 | 3/2017 | Lee et al. |
| 2002/0167829 A1* | 11/2002 | Friedman ............... G11C 5/025 365/50 |
| 2004/0044710 A1 | 3/2004 | Harrison et al. |
| 2006/0106905 A1 | 5/2006 | Chren, Jr. |
| 2010/0017559 A1* | 1/2010 | Fruin ..................... G06F 3/0607 711/103 |
| 2014/0067889 A1* | 3/2014 | Mortensen ............... G06F 7/57 708/201 |
| 2016/0027790 A1* | 1/2016 | Zhang ................ H01L 27/1128 438/128 |
| 2017/0213722 A1* | 7/2017 | Weng ..................... G03F 7/039 |

\* cited by examiner

| FUNC | LUT SIZE | Taylor Series |
|---|---|---|
| CBRT | 24 kbit | 6 |
| EXP | 2 kbit | 5 |
| LN | 24 kbit | 6 |
| SIN | 6 kbit | 9 |
| COS | 6 kbit | 9 |
| TAN | 0 | 15 |
| ATAN | 0 | 22 |

Fig. 1

| Memory | Latency | Internal Placement | Cell Area | Writ-ability |
|---|---|---|---|---|
| SRAM | ~1ns | 2-D | ~120$F^2$ | Yes |
| Mask-ROM | ~2ns | 2-D | ~30$F^2$ | No |
| eDRAM | ~6ns | 2-D | ~60$F^2$ | Yes |
| NOR | ~30ns | 2-D | ~10$F^2$ | Yes |
| NAND | ~1us | 2-D | ~5$F^2$ | Yes |
| 3D-P | ~10ns | 3-D | ~4$F^2$ | No |
| 3D-W | ~50ns | 3-D | ~4$F^2$ | Yes |

Fig. 2

| Precision | Bit | LUT Size | Taylor Series |
|---|---|---|---|
| Half Precision | 16-bit | 1Mbit | 0 |
| Single Precision | 32-bit | 4Mbit | 1 |
| Double Precision | 64-bit | 12Mbit | 2 |
| Extended Double Precision | 80-bit | 20Mbit | 3 |

PROCESSOR FOR REALIZING AT LEAST TWO CATEGORIES OF FUNCTIONS

CROSS-REFERENCE TO RELATED APPLICATIONS

This application claims priority from Chinese Patent Application 201610307350.1, filed on May 10, 2016; Chinese Patent Application 201710315871.6, filed on May 8, 2017, in the State Intellectual Property Office of the People's Republic of China (CN), the disclosure of which are incorporated herein by references in their entireties.

BACKGROUND

1. Technical Field of the Invention

The present invention relates to the field of integrated circuit, and more particularly to processors.

2. Prior Art

Conventional processors use logic-based computation (LBC), which realizes mathematical functions primarily with logic circuits (e.g. XOR circuit). Logic circuits are suitable for arithmetic operations (i.e. addition, subtraction and multiplication), but not for non-arithmetic functions (e.g. elementary functions, special functions).

The conventional processors support a small set of basic non-arithmetic functions (e.g. basic algebraic functions and basic transcendental functions), which are realized by a combination of arithmetic operations and look-up tables (LUT). These functions are referred to as built-in functions. For example, U.S. Pat. No. 5,954,787 issued to Eun on Sep. 21, 1999 taught a method for generating sine/cosine functions using LUTs; U.S. Pat. No. 9,207,910 issued to Azadet et al. on Dec. 8, 2015 taught a method for calculating a power function using LUTs.

FIG. 1 lists all built-in functions supported by an Intel Itanium (IA-64) processor (referring to Harrison et al. "The Computation of Transcendental Functions on the IA-64 Architecture", Intel Technical Journal, Q4 1999, hereinafter Harrison). The IA-64 processor supports a total of 7 built-in functions, each using a relatively small LUT (from 0 to 24 kb) in conjunction with a relatively high-order Taylor series (from 5 to 22).

Conventional processors suffer a drawback. They use a single type of memory (e.g. mask-ROM) to store the LUTs for different functions. Because some functions are commonly used and other non-common functions are less commonly used, using the mask-ROM to store the LUT for the non-common functions are wasteful. On the other hand, because some functions require high-speed implementation and other non-fast functions do not require high-speed implementation, using the high-speed memory to store the LUT for the non-fast functions are also wasteful.

Objects and Advantages

It is a principle object of the present invention to optimize the realization of mathematical functions based on the re-usability, cost and speed requirements.

It is a further object of the present invention to realize common and non-common functions in a single processor.

It is a further object of the present invention to realize fast functions and non-fast functions in a single processor.

In accordance with these and other objects of the present invention, the present invention discloses a processor for realizing at least two categories of functions.

SUMMARY OF THE INVENTION

The present invention discloses a processor for realizing at least two categories of functions. The preferred processor uses memory-based computation (MBC), which realizes a mathematical function primarily with a memory which stores the look-up table (LUT) related to the mathematical function. Although arithmetic operations are still performed, the MBC only needs to calculate a polynomial to a lower order because it uses a larger LUT than the LBC. For the MBC, the fraction of computation done by the LUT could be more than that by the arithmetic operations.

To increase the re-usability, lower the cost and improve the performance, the preferred processor realizes different categories of mathematical functions by different types of memories. There are two methods to categorize the mathematical functions, each of which is associated with a preferred processor.

For the first method of categorization, the mathematical functions are categorized into common functions and non-common functions. The common functions are commonly used functions. Examples of common functions include basic algebraic functions and basic transcendental functions. The non-common functions are less commonly used functions. Examples of non-common functions include elementary functions and special functions. The first method of categorization is associated with a first preferred processor, which comprises a fixed look-up table circuit (LTC) and a writable LTC. The fixed LTC comprises at least a printed memory array storing at least a portion of an LUT related to at least a common function, whereas the writable LTC comprises at least a writable memory array storing at least a portion of an LUT related to at least a non-common function. Note that the LUT related to the common function is written into the fixed LTC during the manufacturing process of the first preferred processor, while the LUT related to the non-common function is written into the writable LTC after the manufacturing process of the first preferred processor is complete. Because the function-related LUT can be written into the writable LTC in the field of use, and can be even erased and re-written afterwards, the first preferred processor can realize different functions based on the customer's needs after shipping.

Accordingly, the present invention discloses a processor for realizing at least two categories of functions (i.e. common functions and non-common functions), comprising: a fixed LTC comprising a printed memory array for storing at least a first portion of a first LUT related to a first function, wherein said first LUT is written during the manufacturing process of said processor; a writable LTC comprising a writable memory array for storing at least a second portion of a second LUT related to a second function, wherein said second LUT is written after the manufacturing process of said processor is complete.

For the second method of categorization, the mathematical functions are categorized into fast functions and non-fast functions. The fast functions are the functions that require fast implementation, whereas the non-fast functions are the functions which do not require fast implementation. The second method of categorization is associated with a second preferred processor, which comprises a two-dimensional (2-D) LTC and a three-dimensional (3-D) LTC. The 2-D LTC comprises at least a 2-D memory array storing at least a portion of an LUT related to at least a fast function, whereas the 3-D LTC comprises at least a 3-D memory array storing at least a portion of an LUT related to at least a non-fast function. Note that all memory cells of the 2-D memory array are located on a 2-D plane, i.e. they are formed on the surface of a semiconductor substrate. On the other hand, the memory cells of the 3-D memory array are located in a 3-D space, i.e. they are vertically stacked above each other. Based on single-crystalline semiconductor material, the 2-D memory array is faster and more suitable for fast functions. On the other hand, occupying no substrate area, the 3-D memory array has a lower storage cost. Storing the LUTs related to the fast functions into the 2-D memory array while storing the LUTs related to the non-fast functions into the 3-D memory array can lower the overall cost of the second preferred processor without sacrificing its performance.

Accordingly, the present invention discloses another processor for realizing at least two categories of functions (i.e. fast functions and non-fast functions), comprising: a semiconductor substrate; a 2-D LTC comprising a 2-D memory array for storing at least a third portion of a third LUT related to a third function, wherein said 2-D memory array is formed on said semiconductor substrate; a 3-D LTC comprising a 3-D memory array for storing at least a fourth portion of a fourth LUT related to a fourth function, wherein said fourth memory array is formed above said semiconductor substrate.

BRIEF DESCRIPTION OF THE DRAWINGS

FIG. 1 lists all transcendental functions supported by an Intel Itanium (IA-64) processor (prior art);

FIG. 2 compares various types of memories;

Figures 3A, 3C:
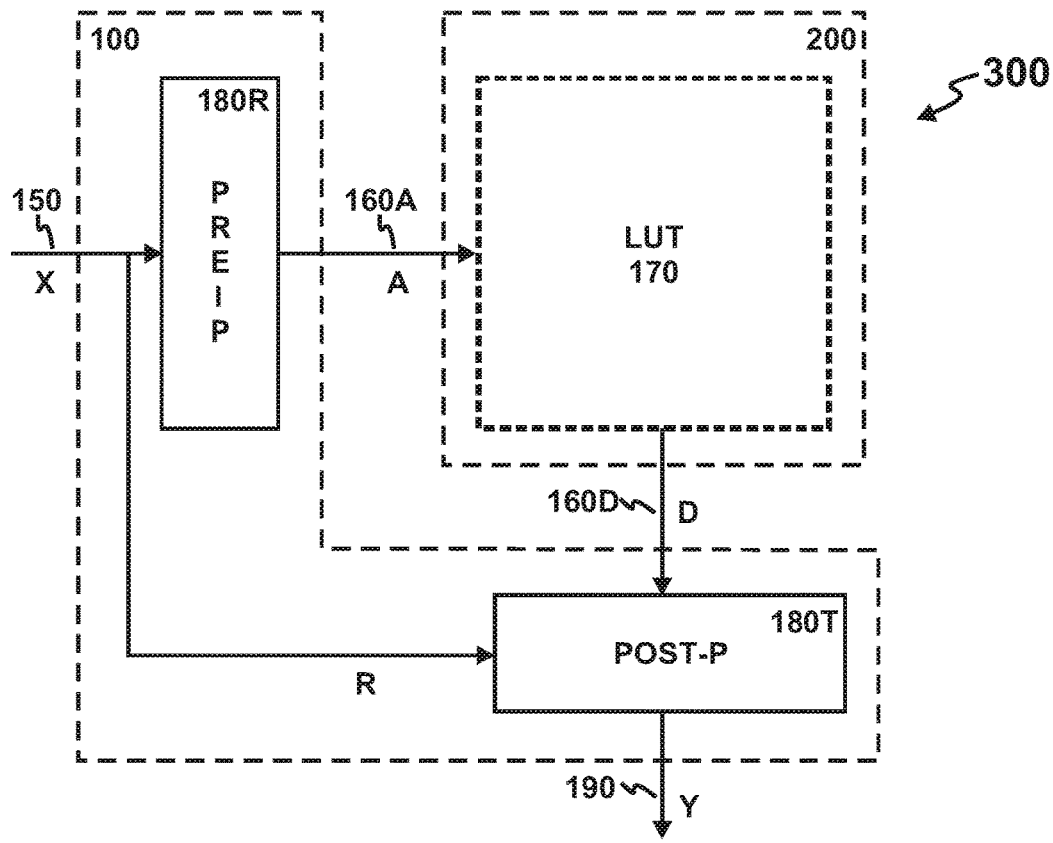
FIG. 3A is a simplified block diagram of a typical MBC-based processor.
FIG. 3C lists the LUT size and Taylor series for realizing mathematical functions with various precisions.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments. The symbol "/" means a relationship of "and" or "or".

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

The present invention discloses a processor for realizing at least two categories of functions. The preferred processor uses memory-based computation (MBC), which realizes a mathematical function primarily with a memory which stores the look-up table (LUT) related to the mathematical function. Although arithmetic operations are still performed, the MBC only needs to calculate a polynomial to a lower order because it uses a larger LUT than the LBC. For the MBC, the fraction of computation done by the LUT could be more than that by the arithmetic operations.

The look-up table circuits (LTC) may comprise various types of memory arrays. Based on their programming mechanisms, the memory arrays can be categorized into printed memory array and writable memory array. For the printed memory array, the data can be recorded thereto using a printing method during the manufacturing process. Note that the data are permanently stored and cannot be changed. The printing methods include photo-lithography (i.e. mask-programming to form mask-ROM), nano-imprint, e-beam lithography, DUV lithography, laser programming and other methods. For the writable memory array, the data can be recorded thereto using an electrical programming method. The writable memory includes OTP, SRAM, DRAM, EPROM, EEPROM, and flash memory. Among them, the OTP is one-time programmable, while the SRAM, DRAM, EPROM, EEPROM and flash memory are re-programmable.

Based on their internal placements, the memory arrays can be categorized into 2-D memory array (or, planar memory array) and 3-D memory array. For the 2-D memory array, all of its memory cells are located on a 2-D plane. They are formed on the surface of a semiconductor substrate, i.e. the transistors and/or diodes of the memory cells are formed on the substrate. For the 3-D memory array, its memory cells are located in a 3-D space. They are vertically stacked, i.e. the transistors and/or diodes of the memory cells are formed above the substrate, not occupying any substrate area. The 2-D memory array includes 2-D printed memory array and 2-D writable memory array, while the 3-D memory array includes 3-D printed memory array (3D-P, referring to U.S. patent application Ser. No. 14/875,716) and 3-D writable memory array (3D-W, also known as 3D-EPROM, referring to U.S. Pat. No. 5,835,396). Examples of the 3D-W include 3D-OTP, 3D-XPoint, and 3D-NAND.

FIG. 2 compares various types of memories. SRAM is a 2-D writable memory, with a latency of ~1 ns and a cell area of ~120$F^2$. The mask-ROM is a 2-D printed memory, with a latency of ~2 ns and a cell area of ~30$F^2$. The eDRAM (embedded DRAM) is a 2-D writable memory with a latency of ~6 ns and a cell area of ~60$F^2$. The NOR flash is a 2-D writable memory with a latency of ~30 ns and a cell area of ~10$F^2$. The NAND flash is a 2-D writable memory with a latency of ~1 us and a cell area of ~5$F^2$. The 3D-P is a 3-D printed memory with a latency of ~10 ns and a cell area of ~4$F^2$. The 3D-W is a 3-D writable memory with a latency of ~50 ns and a cell area of ~4$F^2$.

Figure 3B:
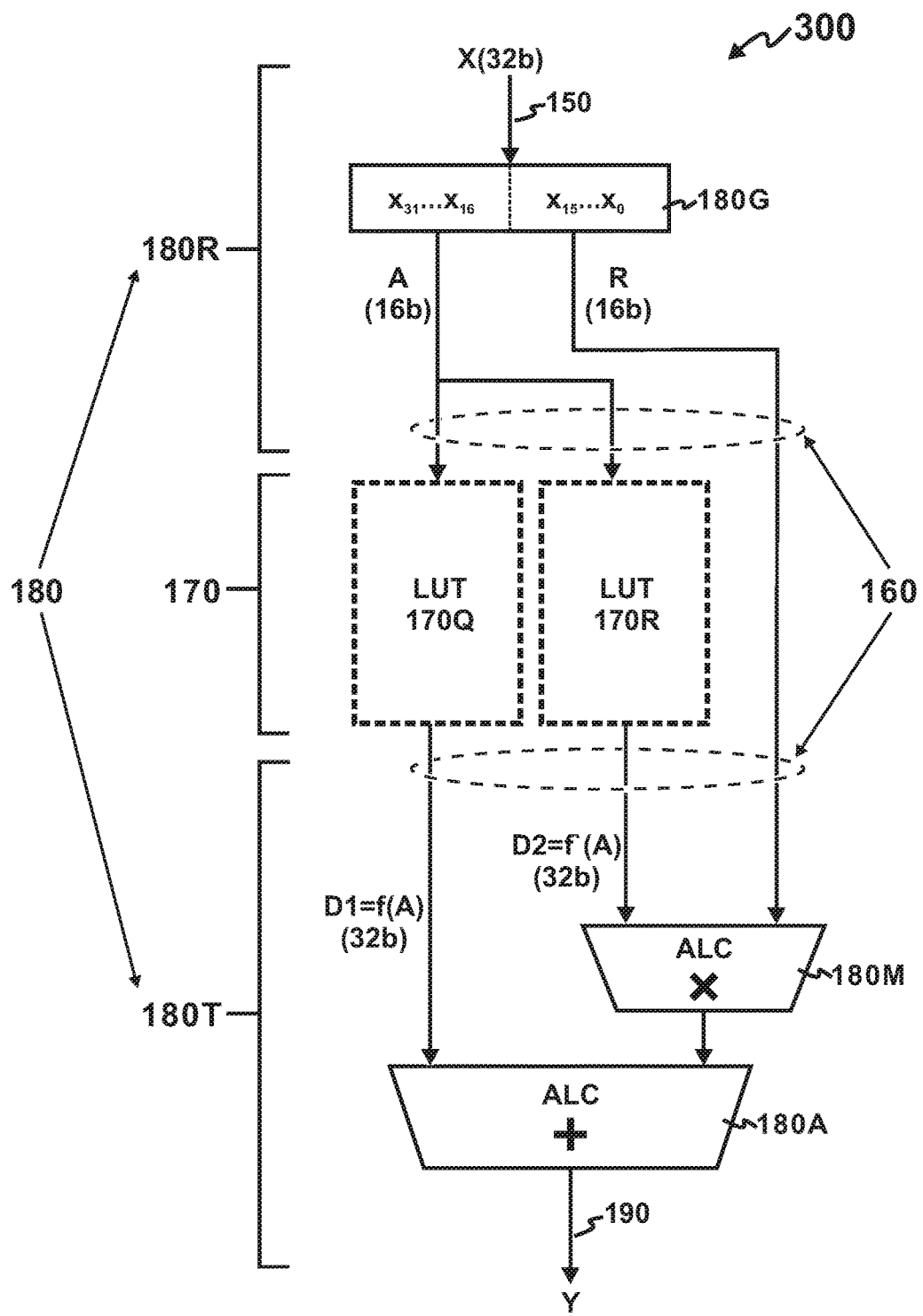
FIG. 3B is a block diagram of a typical MBC-based processor for realizing a single-precision function.

Referring now to FIGS. 3A-3C, a typical MBC-based processor 300 is disclosed. FIG. 3A is its simplified block diagram. It comprises a logic circuit 100 and a memory circuit 200. The logic circuit 100 comprises a pre-processing circuit 180R and a post-processing circuit 180T, whereas the memory circuit 200 comprises at least an LTC 170. The LTC 170 comprises a memory array for storing the function-related LUT. The pre-processing circuit 180R converts the input variable (X) 150 into an address (A) 160A of the LUT 170. After the data (D) 160D at the address (A) is read out from the LUT 170, the post-processing circuit 180T converts it into the function value (Y) 190. A residue (R) of the input variable (X) is fed into the post-processing circuit 180T to improve the computational precision.

FIG. 3B shows a typical MBC-based processor 300 for realizing a single-precision mathematical function Y=f(X). The LUT 170 comprises two LUTs 170Q, 170R with 2 Mb capacity each (16-bit input and 32-bit output): the LUT 170Q stores the function value D1=f(A), while the LUT 170R stores the first-order derivative value D2=f'(A). The ALC 180 comprises a pre-processing circuit 180R (mainly comprising an address buffer) and a post-processing circuit 180T (comprising an adder 180A and a multiplier 180M). During computation, a 32-bit input variable X ($x_{31}$ ... $x_0$) is sent to the processor 300 as an input 150. The pre-processing circuit 180R extracts the higher 16 bits ($x_{31}$ ... $x_{16}$) and sends it as a 16-bit address input A to the LUT 170. The pre-processing circuit 180R further extracts the lower 16 bits ($x_{15}$ ... $x_0$) and sends it as a 16-bit input residue R to the post-processing circuit 180T. The post-processing circuit 180T performs a polynomial interpolation to generate a 32-bit output value Y 190. In this case, the polynomial interpolation is a first-order Taylor series: Y(X)=D1+D2*R=f(A)+f'(A)*R. Apparently, a higher-order polynomial interpolation (e.g. higher-order Taylor series) can be used to improve the computational precision.

When realizing a mathematical function, combining the LUT with polynomial interpolation can achieve a high precision without using an excessively large LUT. For example, if only LUT (without any polynomial interpolation) is used to realize a single-precision function (32-bit input and 32-bit output), it would have a capacity of $2^{32}*32=128$ Gb. By combining polynomial interpolation, significantly smaller LUTs can be used. In the above embodiment, a single-precision function can be realized using a total of 4 Mb LUT (i.e. 2 Mb for the function values, and 2 Mb for the first-derivative values) in conjunction with a first-order Taylor series. This is significantly less than the LUT-only approach (4 Mb vs. 128 Gb).

FIG. 3C lists the LUT size and Taylor series for realizing mathematical functions with various precisions. It uses a range-reduction method taught by Harrison. For the half precision (16 bit), the required LUT capacity is $2^{16}16=1$ Mb and no Taylor series is needed; for the single precision (32 bit), the required LUT capacity is $2^{16}*32*2=4$ Mb and a first-order Taylor series is needed; for the double precision (64 bit), the required LUT capacity is $2^{16}*64*3=12$ Mb and a second-order Taylor series is needed; for the extended double precision (80 bit), the required LUT capacity is $2^{16}*80*4=20$ Mb and a third-order Taylor series is needed. To those skilled in the art, other combination of the LUT and polynomial interpolation can be used to further reduce the LUT capacity.

Besides elementary functions, the preferred embodiment of FIGS. 3A-3B can be used to implement non-elementary functions such as special functions. Special functions can be defined by means of power series, generating functions, infinite products, repeated differentiation, integral representation, differential difference, integral, and functional equations, trigonometric series, or other series in orthogonal functions. Important examples of special functions are gamma function, beta function, hyper-geometric functions, confluent hyper-geometric functions, Bessel functions, Legrendre functions, parabolic cylinder functions, integral sine, integral cosine, incomplete gamma function, incomplete beta function, probability integrals, various classes of orthogonal polynomials, elliptic functions, elliptic integrals, Lame functions, Mathieu functions, Riemann zeta function, automorphic functions, and others. The processor will simplify the computation of special functions and promote their applications in scientific computation.

To increase the re-usability, lower the cost and improve the performance, the preferred processor realizes different categories of mathematical functions by different types of memories. There are two methods to categorize the mathematical functions, each of which is associated with a preferred processor.

Figure 4:
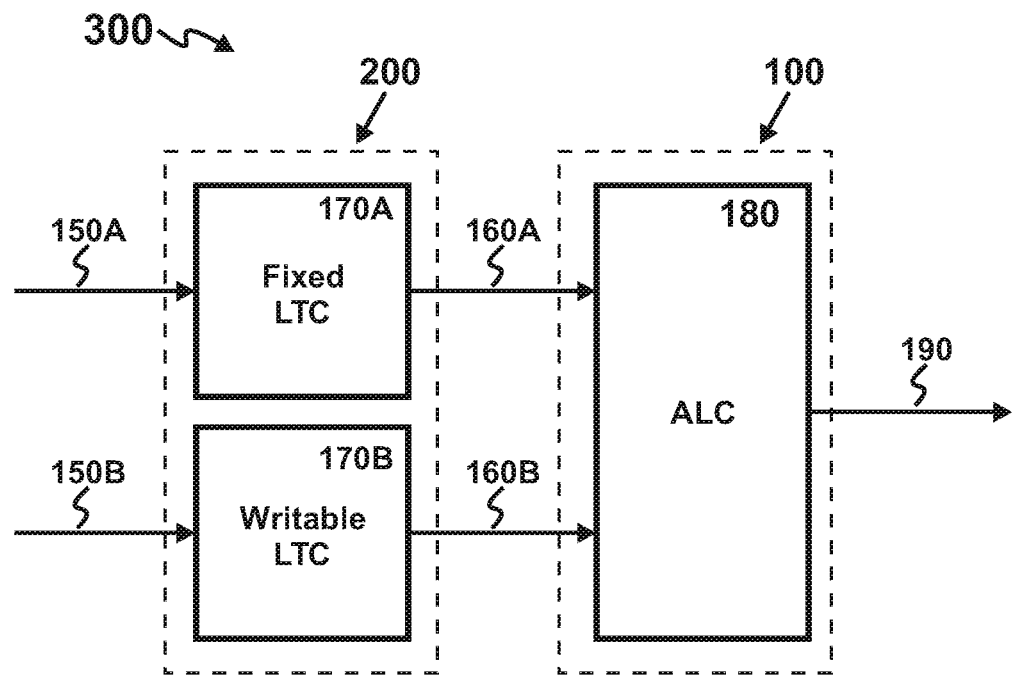
FIG. 4 is a circuit block diagram of a first preferred processor for realizing at least a common function and a non-common function.

For the first method of categorization, the mathematical functions are categorized into common functions and non-common functions. The common functions are commonly used functions. Examples of common functions include basic algebraic functions and basic transcendental functions. The non-common functions are less commonly used functions. Examples of non-common functions include elementary functions and special functions. FIG. 4 discloses a first preferred processor 300 associated with the first method of categorization. It can realize at least a common function and a non-common function. The first preferred processor 300 comprises a memory circuit 200 and a logic circuit 100. The memory circuit 200 comprises a fixed LTC 170A (including input 150A and output 160A) and a writable LTC 170B (including input 150B and output 160B), while the logic circuit 100 comprises an ALC 180. The fixed LTC 170A is used to realize at least a common function. It comprises at least a printed memory array storing at least a portion of an LUT related to the common function. The writable LTC 170B is used to realize at least a non-common function. It comprises at least a writable memory array storing at least another portion of another LUT related to the non-common function. Note that the LUT related to the common function is written into the fixed LTC 170A during the manufacturing process of the first preferred processor 300, while the LUT related to the non-common function is written into the writable LTC after the manufacturing process of the first preferred processor 300 is complete. Because the function-related LUT can be written into the writable LTC in the field of use, and can be even erased and re-written afterwards, the first preferred processor 300 can realize different functions based on the customer's need after shipping. Coupled to the LTCs 170A, 170B, the ALC 180 performs arithmetic operations (e.g. polynomial interpolation) on their outputs 160A, 160B to generate a final output 190.

One example of the first preferred processor 300 comprises a 2-D fixed LTC and a 2-D writable LTC, both of which are formed on the surface of a semiconductor substrate. Among them, the 2-D fixed LTC stores the LUTs related to common functions, while the 2-D writable LTC stores the LUTs related to non-common functions. Another example of the first preferred processor 300 comprises a 3-D fixed LTC and a 3-D writable LTC, both of which comprise vertically stacked memory cells. Among them, the 3-D fixed LTC stores the LUTs related to common functions, while the 3-D writable LTC stores the LUTs related to non-common functions.

Figure 5:
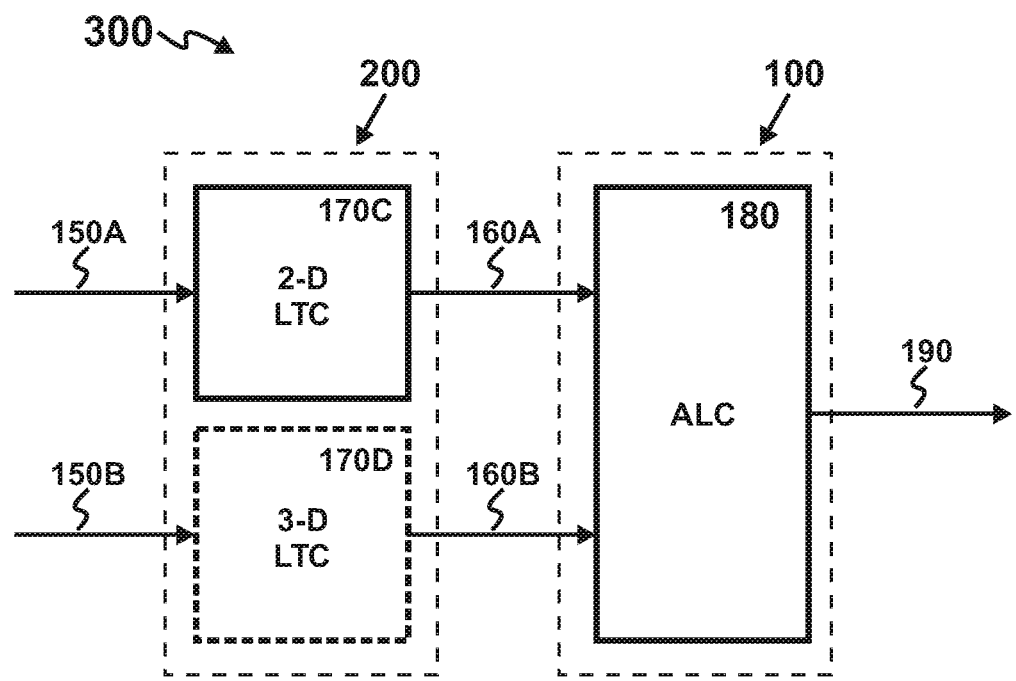
FIG. 5 is a circuit block diagram of a second preferred processor for realizing at least a fast function and a non-fast function.

For the second method of categorization, the mathematical functions are categorized into fast functions and non-fast functions. The fast functions are the functions that require fast implementation, whereas the non-fast functions are the functions which do not require fast implementation. FIG. 5 discloses a second preferred processor 300 associated with the second method of categorization. It can realize fast and non-fast functions. The second preferred processor 300 comprises a memory circuit 200 and a logic circuit 100. The memory circuit 200 comprises a 2-D LTC 170C (including input 150C and output 160C) and a 3-D LTC 170D (including input 150D and output 160D), while the logic circuit 100 comprises an ALC 180. The 2-D LTC 170C comprises at least a 2-D memory array storing at least a portion of an LUT related to at least a fast function, whereas the 3-D LTC 170D comprises at least a 3-D memory array storing at least another portion of another LUT related to at least a non-fast function. Note that all memory cells of the 2-D memory array are located on a 2-D plane, i.e. they are formed on the surface of a semiconductor substrate. On the other hand, the memory cells of the 3-D memory array are located in a 3-D space, i.e. they are vertically stacked. Based on single-crystalline semiconductor material, the 2-D memory array is faster and more suitable for fast functions. On the other hand, occupying no substrate area, the 3-D memory array has a lower storage cost. Storing the LUT related to fast functions into the 2-D memory array and storing the LUT related to non-fast functions into the 3-D memory array can lower the overall cost of the second preferred processor without sacrificing its performance. Coupled to the LTCs 170C, 170D, the ALC 180 performs arithmetic operations (e.g. polynomial interpolation) on their outputs 160C, 160D to generate a final output 190.

Figure 6A:
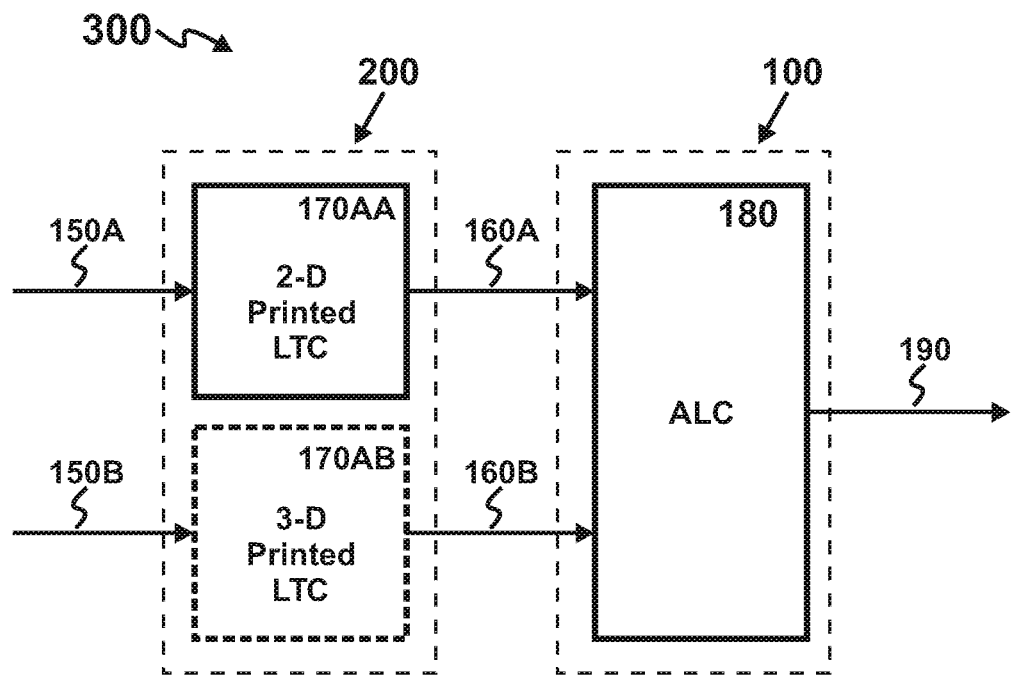
FIGS. 6A-6D are circuit block diagrams of four examples of the second preferred processor.
Figure 6B:
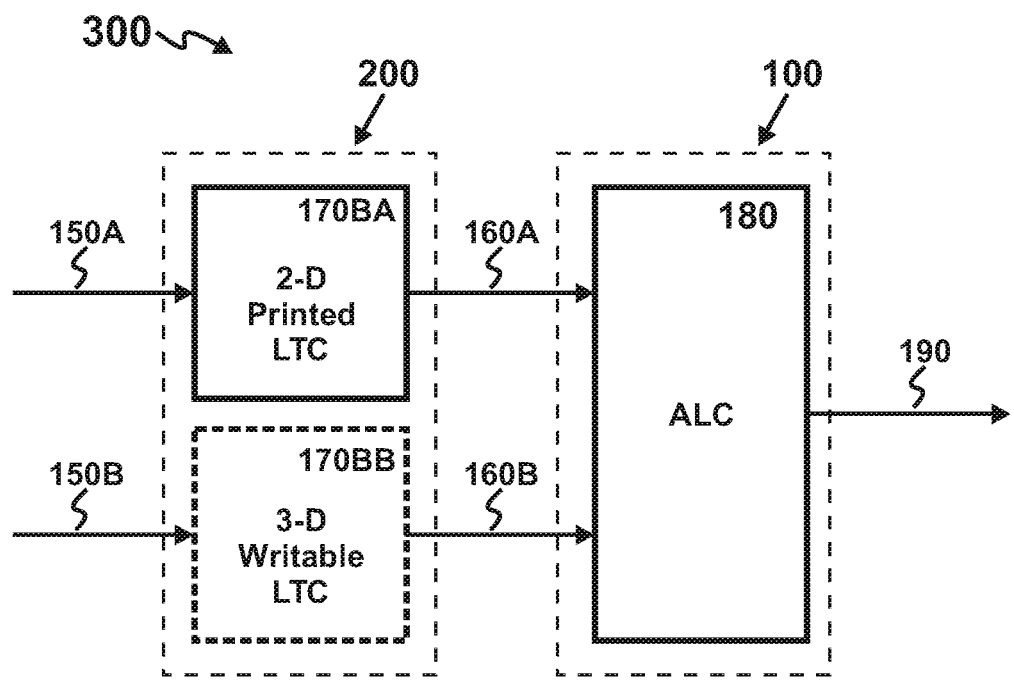
Figure 6C:
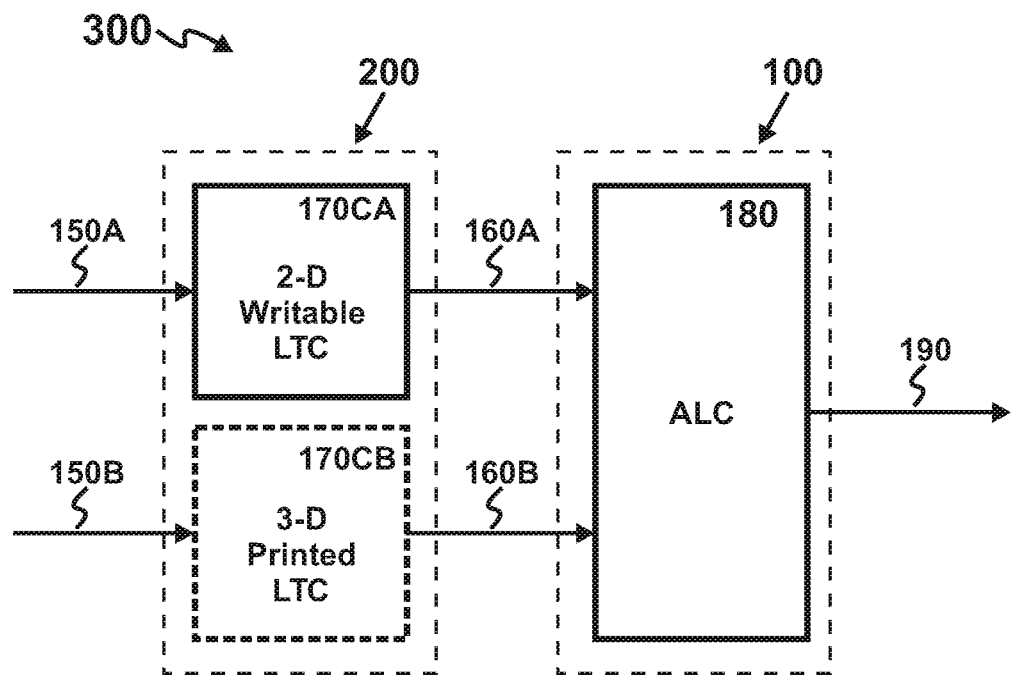
Figure 6D:
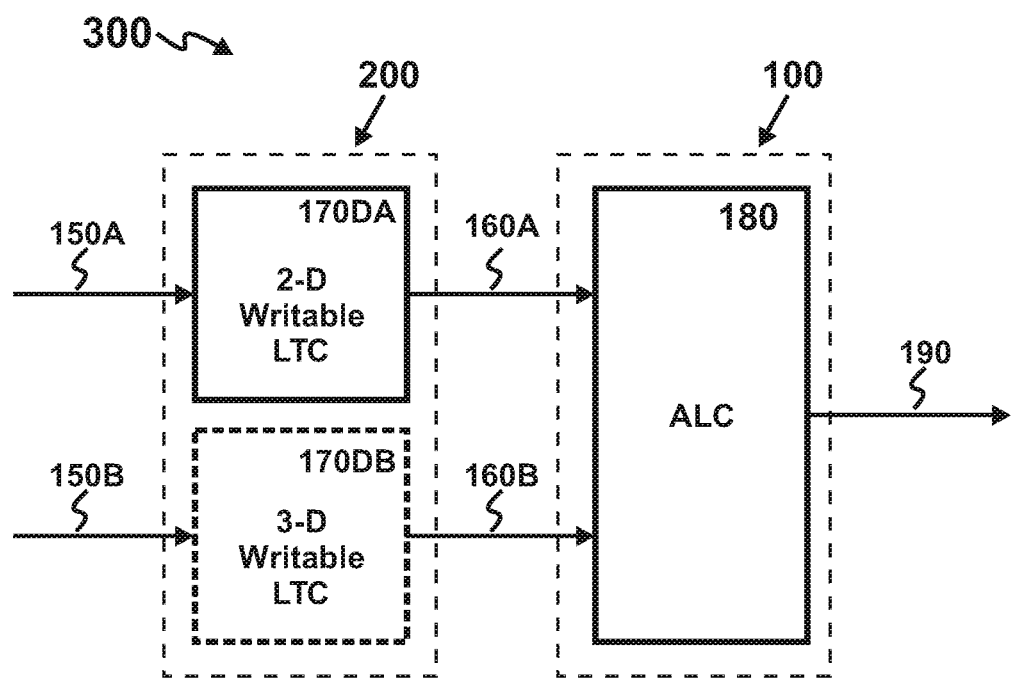

FIGS. 6A-6D show four examples of the second preferred processor 300. In FIG. 6A, the 2-D LTC 170C is a 2-D fixed LTC 170AA for realizing a common fast function; the 3-D LTC 170D is a 3-D fixed LTC 170AB for realizing a common non-fast function. In FIG. 6B, the 2-D LTC 170C is a 2-D fixed LTC 170BA for realizing a common fast function; the 3-D LTC 170D is a 3-D writable LTC 170BB for realizing a non-common non-fast function. In FIG. 6C, the 2-D LTC 170C is a 2-D writable LTC 170CA for realizing a non-common fast function; the 3-D LTC 170D is a 3-D fixed LTC 170CB for realizing a common non-fast function. In FIG. 6D, the 2-D LTC 170C is a 2-D writable LTC 170DA for realizing a non-common fast function; the 3-D LTC 170D is a 3-D writable LTC 170DB for realizing a non-common non-fast function. Apparently, the preferred processor 300 may comprise more LTCs for realizing different combinations of mathematical functions.

Figure 7A:
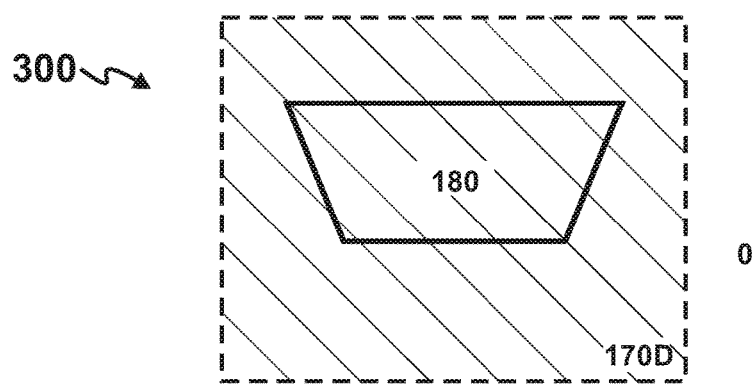
FIGS. 7A-7B are top views of two preferred processors with 3-D integration.
Figure 7A:
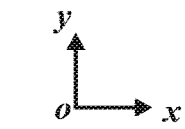
Figure 7B:
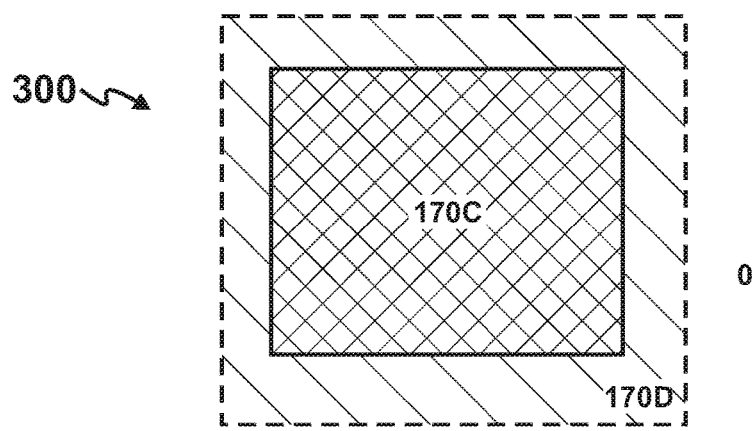
Figure 7B:
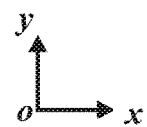
Figure 7C:
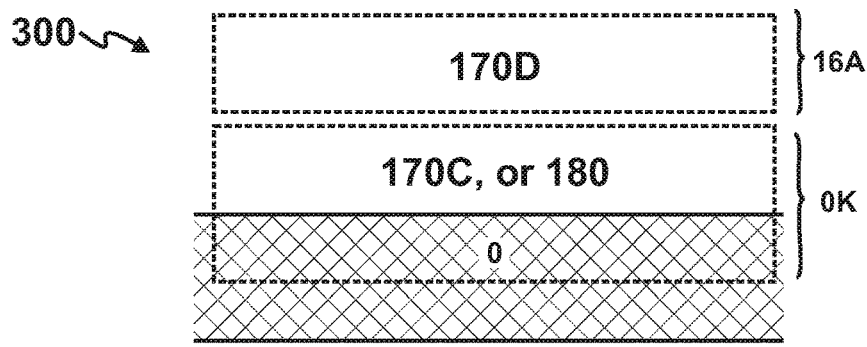
FIG. 7C is a cross-sectional view of these preferred processors.
Figure 7C:
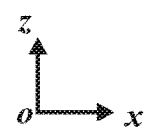

The 3-D memory array offers the benefit of 3-D integration, i.e. the memory cells of the 3-D memory array can be integrated with the 2-D memory array and/or the logic circuit on a single die. FIGS. 7A-7B disclose two examples of the 3-D integration. In FIG. 7A, the 3-D memory array 170D is stacked above the ALC 180. In FIG. 7B, the 3-D memory array 170D is stacked above the 2-D memory array 170C. In these figures, because it is stacked above the substrate 0 and is not part of the substrate 0, the boundary of the 3-D memory array 170D is drawn by dashed lines. The cross-sectional view of FIG. 7C further shows the relationship between the 3-D memory array 170D and the substrate 0. The 2-D memory array 170C and/or the ALC 180 are part of the substrate circuit 0K, while the 3-D memory array 170D is a part of the first memory level 16A, which is stacked above the substrate circuit 0K. The 3-D integration can reduce the die area, while increase the number of functions supported by the preferred processor 300.

While illustrative embodiments have been shown and described, it would be apparent to those skilled in the art that many more modifications than that have been mentioned above are possible without departing from the inventive concepts set forth therein. For example, the preferred processor could be a micro-controller, a central processing unit (CPU), a digital signal processor (DSP), a graphic processing unit (GPU), a network-security processor, an encryption/decryption processor, an encoding/decoding processor, a neural-network processor, or an artificial intelligence (AI) processor. The preferred processors can be found in consumer electronic devices (e.g. personal computers, video game machines, smart phones) as well as engineering and scientific workstations and server machines. The invention, therefore, is not to be limited except in the spirit of the appended claims.

What is claimed is:

1. A processor for realizing at least two categories of functions, comprising:
   a printed memory array for storing at least a first portion of a first look-up table (LUT) for a first mathematical function, wherein data in said first LUT are physically written into said printed memory array during the manufacturing process of said printed memory array;
   a writable memory array for storing at least a second portion of a second LUT for a second mathematical function, wherein data in said second LUT can be electrically written into said writable memory array after the manufacturing process of said writable memory array;
   wherein said printed memory array and said writable memory array comprise physically different memory cells.

2. The processor according to claim 1, wherein said printed memory array is a two-dimensional (2-D) printed memory array.

3. The processor according to claim 1, wherein said printed memory array is a three-dimensional (3-D) printed memory array.

4. The processor according to claim 1, wherein said writable memory array is a 2-D writable memory array.

5. The processor according to claim 1, wherein said writable memory array is a 3-D writable memory array.

6. The processor according to claim 1, wherein data in said first LUT are physically written into said printed memory array using a printing method.

7. The processor according to claim 6, wherein said printing method includes photo-lithography, nano-imprint, e-beam lithography, DUV lithography, and laser programming.

8. The processor according to claim 1, wherein data in said second LUT are electrically written into said writable memory array using an electrical programming method.

9. The processor according to claim 1, wherein said writable memory array is an OTP memory array.

10. The processor according to claim 1, wherein said writable memory array is a re-programmable memory array.

11. A processor for realizing at least two categories of functions, comprising:
    a semiconductor substrate;
    a two-dimensional (2-D) memory array on said semiconductor substrate for storing at least a third portion of a third look-up table (LUT) for a third mathematical function;
    a three-dimensional (3-D) memory array above said semiconductor substrate for storing at least a fourth portion of a fourth LUT for a fourth mathematical function;
    wherein said 2-D memory array and said 3-D memory array are located on different physical levels.

12. The processor according to claim 11, wherein 2-D memory array is a first printed memory array; and, said 3-D memory array is a second printed memory array.

13. The processor according to claim 11, wherein 2-D memory array is a printed memory array; and, said 3-D memory array is a writable memory array.

14. The processor according to claim 11, wherein 2-D memory array is a writable memory array; and, said 3-D memory array is a printed memory array.

15. The processor according to claim 11, wherein 2-D memory array is a first writable memory array; and, said 3-D memory array is a second writable memory array.

16. The processor according to claim 11, wherein said 2-D memory array is faster than said 3-D memory array.

17. The processor according to claim 11, wherein said 3-D memory array has a lower storage cost than said 2-D memory array.

18. The processor according to claim 11, wherein said 3-D memory array at least partially covers said 2-D memory array.

19. The processor according to claim 11, further comprising an arithmetic logic circuit (ALC) on said semiconductor substrate for performing arithmetic operations on selected data from said third or fourth LUT.

20. The processor according to claim 19, wherein said 3-D memory array is stacked above said ALC.

\* \* \* \* \*